United States Patent
Chuang et al.

(10) Patent No.: US 9,478,402 B2
(45) Date of Patent: Oct. 25, 2016

(54) PHOTOMULTIPLIER TUBE, IMAGE SENSOR, AND AN INSPECTION SYSTEM USING A PMT OR IMAGE SENSOR

(71) Applicant: KLA-Tencor Corporation, Milpitas, CA (US)

(72) Inventors: Yung-Ho Chuang, Cupertino, CA (US); David L. Brown, Los Gatos, CA (US); John Fielden, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/198,175

(22) Filed: Mar. 5, 2014

(65) Prior Publication Data
US 2014/0291493 A1 Oct. 2, 2014

Related U.S. Application Data

(60) Provisional application No. 61/807,058, filed on Apr. 1, 2013.

(51) Int. Cl.
*H01L 31/11* (2006.01)
*H01L 31/167* (2006.01)
(Continued)

(52) U.S. Cl.
CPC ............... *H01J 40/06* (2013.01); *H01J 43/08* (2013.01); *H01L 31/103* (2013.01)

(58) Field of Classification Search
CPC .......... H01J 40/06; H01J 40/04; H01J 40/02; H01J 40/00; H01J 43/08; H01J 43/04; H01J 43/02; H01J 43/00; H01L 31/103; H01L 31/0336; H01L 31/0224; H01L 31/12; H01L 31/18
See application file for complete search history.

(56) References Cited

U.S. PATENT DOCUMENTS 3,870,917 A 3/1975 Cuny
3,947,707 A 3/1976 Shannon
(Continued)

FOREIGN PATENT DOCUMENTS

EP 0746871 B1 5/2000
EP 0602983 B1 6/2000
(Continued)

OTHER PUBLICATIONS

Allen et al. "Work Function, Photoelectric Threshold, and Surface States of Atomically Clean Silicon", Physical Review, vol. 127, No. 1, Jul. 1, 1962, pp. 150-158.
(Continued)

*Primary Examiner* — John Lee
(74) *Attorney, Agent, or Firm* — Bever, Hoffman & Harms, LLP

(57) ABSTRACT

A photomultiplier tube includes a semiconductor photocathode and a photodiode. Notably, the photodiode includes a p-doped semiconductor layer, an n-doped semiconductor layer formed on a first surface of the p-doped semiconductor layer to form a diode, and a pure boron layer formed on a second surface of the p-doped semiconductor layer. A gap between the semiconductor photocathode and the photodiode may be less than about 1 mm or less than about 500 µm. The semiconductor photocathode may include gallium nitride, e.g. one or more p-doped gallium nitride layers. In other embodiments, the semiconductor photocathode may include silicon. This semiconductor photocathode can further include a pure boron coating on at least one surface.

10 Claims, 11 Drawing Sheets

(51) Int. Cl.
  *H01J 40/06* (2006.01)
  *H01L 31/103* (2006.01)
  *H01J 43/08* (2006.01)

(56) References Cited

U.S. PATENT DOCUMENTS

| | | | |
|---|---|---|---|
| 4,099,198 A | 7/1978 | Howorth et al. | |
| 4,210,922 A | 7/1980 | Shannon | |
| 4,275,326 A * | 6/1981 | Houtkamp | H01J 9/2278 |
| | | | 313/466 |
| 4,297,587 A | 10/1981 | Baker | |
| 4,348,690 A | 9/1982 | Jastrzebski | |
| 4,467,189 A | 8/1984 | Tsuchiya | |
| 4,555,731 A | 11/1985 | Zinchuk | |
| 4,644,221 A | 2/1987 | Gutierrez et al. | |
| 4,760,031 A | 7/1988 | Janesick | |
| 4,853,595 A | 8/1989 | Alfano et al. | |
| 5,054,683 A | 10/1991 | Haisma et al. | |
| 5,120,949 A | 6/1992 | Tomasetti | |
| 5,144,630 A | 9/1992 | Lin | |
| 5,227,313 A | 7/1993 | Gluck et al. | |
| 5,315,126 A | 5/1994 | Field | |
| 5,376,810 A | 12/1994 | Hoenk et al. | |
| 5,563,702 A | 10/1996 | Emery et al. | |
| 5,717,518 A | 2/1998 | Shafer et al. | |
| 5,719,069 A | 2/1998 | Sparks | |
| 5,731,584 A * | 3/1998 | Beyne | H01J 47/02 |
| | | | 250/374 |
| 5,742,626 A | 4/1998 | Mead et al. | |
| 5,760,809 A | 6/1998 | Malhotra et al. | |
| 5,760,899 A | 6/1998 | Eismann | |
| 5,852,322 A | 12/1998 | Speckbacher | |
| 5,940,685 A | 8/1999 | Loomis et al. | |
| 5,999,310 A | 12/1999 | Shafer et al. | |
| 6,013,399 A | 1/2000 | Nguyen | |
| 6,064,759 A | 5/2000 | Buckley et al. | |
| 6,162,707 A | 12/2000 | Dinh | |
| 6,201,257 B1 | 3/2001 | Stettner et al. | |
| 6,201,601 B1 | 3/2001 | Vaez-Iravani et al. | |
| 6,220,914 B1 | 4/2001 | Lee et al. | |
| 6,271,916 B1 | 8/2001 | Marxer et al. | |
| 6,278,119 B1 | 8/2001 | Nikzad et al. | |
| 6,285,018 B1 | 9/2001 | Aebi et al. | |
| 6,297,879 B1 | 10/2001 | Yang et al. | |
| 6,307,586 B1 | 10/2001 | Costello | |
| 6,346,700 B1 | 2/2002 | Cunningham et al. | |
| 6,362,484 B1 * | 3/2002 | Beyne | H01J 47/02 |
| | | | 250/338.4 |
| 6,373,869 B1 | 4/2002 | Jacob | |
| 6,403,963 B1 | 6/2002 | Nikzad et al. | |
| 6,545,281 B1 | 4/2003 | McGregor | |
| 6,608,676 B1 | 8/2003 | Zhao et al. | |
| 6,711,283 B1 | 3/2004 | Soenksen | |
| 6,837,766 B2 | 1/2005 | Costello | |
| 7,005,637 B2 | 2/2006 | Costello et al. | |
| 7,039,157 B2 | 5/2006 | Fuji et al. | |
| 7,126,699 B1 | 10/2006 | Wihl et al. | |
| 7,130,039 B2 | 10/2006 | Vaez-Iravani et al. | |
| 7,283,166 B1 | 10/2007 | Billman | |
| 7,313,155 B1 | 12/2007 | Mu | |
| 7,345,825 B2 | 3/2008 | Chuang et al. | |
| 7,352,457 B2 | 4/2008 | Kvamme et al. | |
| 7,446,474 B2 * | 11/2008 | Maldonado | B82Y 10/00 |
| | | | 313/541 |
| 7,465,935 B2 | 12/2008 | Urano et al. | |
| 7,525,649 B1 | 4/2009 | Leong et al. | |
| 7,528,943 B2 | 5/2009 | Brown et al. | |
| 7,586,108 B2 | 9/2009 | Nihtianov et al. | |
| 7,609,309 B2 | 10/2009 | Brown et al. | |
| 7,741,666 B2 | 6/2010 | Nozaki et al. | |
| 7,750,280 B2 | 7/2010 | Hwang et al. | |
| 7,791,170 B2 | 9/2010 | Chiang et al. | |
| 7,800,040 B2 | 9/2010 | Blacksberg et al. | |
| 7,875,948 B2 | 1/2011 | Hynecek et al. | |
| 7,928,382 B2 | 4/2011 | Hatakeyama et al. | |
| 7,952,633 B2 | 5/2011 | Brown et al. | |
| 7,985,658 B2 | 7/2011 | Lei et al. | |
| 7,999,342 B2 | 8/2011 | Hsu et al. | |
| 8,017,427 B2 | 9/2011 | Manabe | |
| 8,138,485 B2 | 3/2012 | Nihtianov et al. | |
| 8,309,443 B2 | 11/2012 | Tanaka et al. | |
| 8,323,406 B2 | 12/2012 | Bondokov et al. | |
| 8,450,820 B2 * | 5/2013 | Nanver | H01L 31/022408 |
| | | | 257/428 |
| 8,455,971 B2 | 6/2013 | Chen et al. | |
| 8,513,587 B2 | 8/2013 | Wang et al. | |
| 8,514,587 B2 | 8/2013 | Zhang et al. | |
| 8,629,384 B1 | 1/2014 | Biellak et al. | |
| 8,665,536 B2 | 3/2014 | Armstrong | |
| 8,686,331 B2 | 4/2014 | Armstrong | |
| 8,755,417 B1 | 6/2014 | Dribinski | |
| 8,873,596 B2 | 10/2014 | Dribinski | |
| 8,896,917 B2 | 11/2014 | Armstrong | |
| 8,929,406 B2 | 1/2015 | Chuang et al. | |
| 8,976,343 B2 | 3/2015 | Genis | |
| 2001/0017344 A1 * | 8/2001 | Aebi | H01J 31/26 |
| | | | 250/214 VT |
| 2002/0191834 A1 | 12/2002 | Fishbaine | |
| 2003/0222579 A1 | 12/2003 | Habib et al. | |
| 2004/0021061 A1 | 2/2004 | Bijkerk | |
| 2004/0056279 A1 * | 3/2004 | Niigaki | H01J 1/34 |
| | | | 257/202 |
| 2004/0227070 A1 | 11/2004 | Bateman et al. | |
| 2005/0122021 A1 | 6/2005 | Smith | |
| 2005/0167575 A1 | 8/2005 | Benz et al. | |
| 2005/0264148 A1 | 12/2005 | Maldonado et al. | |
| 2006/0054778 A1 | 3/2006 | Suhling | |
| 2006/0055321 A1 | 3/2006 | Maldonado et al. | |
| 2006/0069460 A1 | 3/2006 | Smith et al. | |
| 2006/0170324 A1 * | 8/2006 | Machuca | H01J 1/34 |
| | | | 313/364 |
| 2007/0002465 A1 | 1/2007 | Chuang et al. | |
| 2007/0034987 A1 | 2/2007 | Costello et al. | |
| 2007/0096648 A1 | 5/2007 | Nakajima et al. | |
| 2007/0103769 A1 | 5/2007 | Kuwabara | |
| 2007/0188744 A1 | 8/2007 | Leslie et al. | |
| 2007/0291810 A1 | 12/2007 | Luo et al. | |
| 2008/0044932 A1 | 2/2008 | Samoilov et al. | |
| 2008/0267241 A1 | 10/2008 | Brown et al. | |
| 2008/0315092 A1 | 12/2008 | Kley | |
| 2008/0315121 A1 | 12/2008 | Nihtianov et al. | |
| 2009/0021717 A1 | 1/2009 | Nihtianov et al. | |
| 2009/0091752 A1 | 4/2009 | Terasawa et al. | |
| 2009/0108207 A1 | 4/2009 | Liu | |
| 2009/0125242 A1 | 5/2009 | Choi | |
| 2009/0128912 A1 | 5/2009 | Okada | |
| 2009/0168152 A1 | 7/2009 | Gelernt et al. | |
| 2009/0180176 A1 | 7/2009 | Armstrong et al. | |
| 2010/0102213 A1 | 4/2010 | Garris | |
| 2010/0103409 A1 | 4/2010 | Ohshima et al. | |
| 2010/0148667 A1 | 6/2010 | Niigaki et al. | |
| 2010/0188655 A1 | 7/2010 | Brown et al. | |
| 2010/0301437 A1 | 12/2010 | Brown et al. | |
| 2011/0101219 A1 | 5/2011 | Uchiyama et al. | |
| 2011/0116077 A1 | 5/2011 | Chuang et al. | |
| 2011/0169116 A1 | 7/2011 | Nanver et al. | |
| 2011/0234790 A1 | 9/2011 | True | |
| 2011/0256655 A1 | 10/2011 | Nikzad et al. | |
| 2011/0261354 A1 * | 10/2011 | Sinfield | G01J 3/02 |
| | | | 356/301 |
| 2011/0291109 A1 * | 12/2011 | Wraback | H01L 31/107 |
| | | | 257/77 |
| 2012/0012811 A1 * | 1/2012 | DeFlumere | G02B 5/122 |
| | | | 257/10 |
| 2012/0012957 A1 | 1/2012 | Larsen | |
| 2012/0081684 A1 | 4/2012 | Den Oef et al. | |
| 2012/0132823 A1 * | 5/2012 | Menge | G01T 3/06 |
| | | | 250/390.11 |
| 2012/0160993 A1 * | 6/2012 | Nevet | G01J 11/00 |
| | | | 250/214.1 |
| 2012/0170021 A1 | 7/2012 | Walsh | |
| 2012/0228485 A1 | 9/2012 | Iwakiri et al. | |
| 2012/0268722 A1 | 10/2012 | Nihtianov et al. | |
| 2013/0009069 A1 | 1/2013 | Okada | |

(56) References Cited

U.S. PATENT DOCUMENTS

| | | |
|---|---|---|
| 2013/0016346 A1 | 1/2013 | Romanovsky et al. |
| 2013/0017205 A1 | 1/2013 | Giaccia et al. |
| 2013/0020491 A1 | 1/2013 | Mazzillo |
| 2013/0056843 A1* | 3/2013 | Lee ................ H01L 31/107 257/438 |
| 2013/0077086 A1 | 3/2013 | Chuang et al. |
| 2013/0082241 A1 | 4/2013 | Kub et al. |
| 2013/0088706 A1 | 4/2013 | Chuang et al. |
| 2013/0126705 A1 | 5/2013 | Maleev |
| 2013/0148112 A1 | 6/2013 | Chuang et al. |
| 2013/0169957 A1 | 7/2013 | Wolf et al. |
| 2013/0176552 A1 | 7/2013 | Brown et al. |
| 2013/0194445 A1 | 8/2013 | Brown et al. |
| 2013/0264481 A1 | 10/2013 | Chern et al. |
| 2013/0270663 A1 | 10/2013 | Lin et al. |
| 2013/0313440 A1 | 11/2013 | Chuang et al. |
| 2013/0320211 A1 | 12/2013 | Park et al. |
| 2013/0336574 A1 | 12/2013 | Nasser-Ghodsi |
| 2014/0034816 A1 | 2/2014 | Chuang et al. |
| 2014/0111799 A1 | 4/2014 | Lei et al. |
| 2014/0158864 A1 | 6/2014 | Brown et al. |
| 2014/0203386 A1* | 7/2014 | Bui ................ H01L 27/1463 257/431 |
| 2014/0204963 A1 | 7/2014 | Chuang et al. |
| 2014/0226140 A1 | 8/2014 | Chuang et al. |
| 2014/0246595 A1* | 9/2014 | Menge ................ G01T 3/06 250/369 |
| 2014/0291493 A1* | 10/2014 | Chuang ............. H01L 31/103 250/216 |
| 2014/0305367 A1 | 10/2014 | Chuang et al. |
| 2014/0362203 A1 | 12/2014 | Delaney |
| 2015/0007765 A1 | 1/2015 | Dribinski |
| 2015/0177159 A1 | 6/2015 | Brown et al. |
| 2015/0200216 A1 | 7/2015 | Muramatsu et al. |
| 2015/0268176 A1 | 9/2015 | Deng |
| 2015/0275393 A1 | 10/2015 | Bondokov et al. |
| 2015/0295998 A1 | 10/2015 | Morrill et al. |

FOREIGN PATENT DOCUMENTS

| | | |
|---|---|---|
| EP | 1939917 A2 | 7/2008 |
| EP | 2346094 A1 | 7/2011 |
| JP | H0511287 A | 1/1993 |
| JP | 10171965 | 6/1998 |
| JP | 2003043533 A | 2/2003 |
| JP | 2004-31452 A | 1/2004 |
| JP | 200786108 | 4/2007 |
| JP | 2007249092 A | 9/2007 |
| JP | 2007298932 A | 11/2007 |
| JP | 2009-117454 A | 5/2009 |
| KR | 100688497 | 3/2007 |
| KR | 100826407 | 5/2008 |
| RU | 2297070 | 4/2007 |
| RU | 2297070 C2 | 4/2007 |
| WO | 9532518 A1 | 11/1995 |
| WO | 9617372 A1 | 6/1996 |
| WO | 2007035858 A2 | 3/2007 |
| WO | 2011091159 | 7/2011 |
| WO | 2013006867 A1 | 1/2013 |
| WO | 2014067754 | 5/2014 |

OTHER PUBLICATIONS

Fu et al. "Optimizing GaN photocathode structure for higher quantum efficiency", Optik, vol. 123, No. 9, May 2012, pp. 756-768.

Henderson, Brian S. "Study of Negative Electron Affinity GaAs Photocathodes", Department of Physics and Astronomy, Rice University, Houston, TX, Aug. 7, 2009, 18 pages.

Howorth et al. "Transmission silicon photoemiUem and electron mul ipliers". Journal of Physics D: Applied Physics, vol. 9, No. 5, Apr. 1, 1976, pp. 785-794.

Martinelli, Ramon U. "Infrared Photoemission Photoomissionhom Silicon", Applied Physics Letters, vol. 16, No. 7, Apr. 1, 1970, pp. 261-262.

Martinelli, Ramon U. "Reflection and Transmiss on Secondary Emission from Silicon", Applied Physics Letters, vol. 17, No. 8, Oct. 15, 1970, pp. 313-314.

Nanver, Lis K. "Silicon Photodiodes for Low Penetration Depth Beams such as DUV/VUV/EUV Light and Low-Energy Electrons". Advances in Photodiodes,G. Betta, ed., Chapter 10, Mar. 22, 2011, pp. 205-224.

Nanver et al. "Pure-Boron Chemical-Vapor-Deposited Layers: a New Material for Silicon Device Processing", 18th IEEE International Conference on Advanced Thermal Processing of Semiconductors (RTP), Sep. 28, 2010-Oct. 1, 2010, pp. 136-139.

Sarubbi et al. "Chemical Vapor Deposition of α-Boron Layers on Silicon for Controlled Nanometer-Deep p+n Junction Formation", Journal of Electronic Materials, vol. 39, No. 2, 2010, pp. 162-173.

Tobin, Kenneth W. "Inspection in Semiconductor Manufacturing", Webster's Encyclopedia of Electrical and Electronic Engineering, Wiley & Sons, NY, 1999, vol. 10, pp. 242-262.

Sobieski, Stanley, "Intensified Charge Coupled Devices for Ultra Low Light Level Imaging", NASA, Goddard Space Flight Center, SPIE vol. 78 (1976) Low Light Level Devices, pp. 73-77.

Herriott, et al., "Folded Optical Delay Lines", Applied Optics 4, #8, pp. 883-889 (1965).

Herriott, et al., "Off-Axis Paths in Spherical Mirror Interferometers", Applied Optics 3, #4, pp. 523-526 (1964).

KLA-Tencor Corporation, U.S. Appl. No. 14/248,045, filed Apr. 8, 2014 and entitled "Passivation of Nonlinear Optical Crystals".

KLA-Tencor Corporation, U.S. Appl. No. 62/059,368, filed Oct. 3, 2014 and entitled "183nm Laser and Inspection System".

KLA-Tencor Corpoation, U.S. Appl. No. 14/210,355, filed Mar. 13, 2014 and entitled "193nm Laser and an Inspection System Using a 193nm Laser", (KLA-057-not yet published).

Raoult, F. et al., "Efficient generation of narrow-bandwidth picosecond pulses by frequency doubling of femtosecond chirped pulses", Jul. 15, 1998 / ol. 23, No. 14 / Optics Letters, pp. 1117-1119.

Sarubbi F et al: "Pure boron-doped photodiodes: a solution for radiation detection in EUV lithography", Proceedings of the 38th European Solid-State Device Research Conference: Edinburgh International Conference Centre, Endiburgh, Scotland, UK, Sep. 15-19, 2008, Piscataway, NJ: IEEE, US, Sep. 15, 2008, pp. 278-281.

KLA-Tencor Corporation; PCT International Search Report dated Dec. 8, 2015 for Application No. PCT/US2015/047307, 3 pages.

Certified priority document U.S. Appl. No. 61/720,700, filed Oct. 31, 2012 corresponding to PCT/EP2013/071080 filed Oct. 9, 2013, pp. 1-44.

Nikzad, Shouleh et al., Delta-doped CCDs: High QE with long-term stability at UV and visible wavelengths, SPIE vol. 2198 (1994), pp. 907-915.

Hecht, Eugene, Optics, 2nd Edition, Adelphi University, 1987, Addison-Wesley Publishing Co., Inc., 3 pages.

Hecht, Eugene, Optics, 4th Edition, India: Pearson Education Pte, Ltd. reprint 2004, 4 pages.

Huang, Qiyu et al., "Back-Side Illuminated Photogate CMOS Active Pixel Sensor Structure With Improved Short Wavelength Response", IEEE Sensors Journal, vol. 11, No. 9, Sep. 2011, 5 pages.

Itzler, Mark et al., "InP-based Geiger-mode avalanche photodiode arrays for three-dimensional imaging at 1.06 μm", Proceedings of SPIE, vol. 7320 (2000), 12 pages.

Niclass, Cristiano et al., "Design and Characterization of a CMOS 3-D Image Sensor Based on Single Photon Avalanche Diodes", IEEE Journal of Solid-State Circuits, vol. 40, No. 9, Sep. 2005, 8 pages.

Paetzel, Rainer et al., "Activation of Silicon Wafer by Excimer Laser" 18th IEEE Conf. Advanced Thermal processing of Semiconductors—RTP 2010, 5 pages.

(56) References Cited

OTHER PUBLICATIONS

Stevanovic, Nenad et al., "A CMOS Image Sensor for High-Speed Imaging", 2000 IEEE Int'l. Conference Solid-State Circuits, 3 pages.

Dulinski, Wojciech et al., "Tests of a backside illuminated monolithic CMOS pixel sensor in an HPD set-up", Nuclear Instruments and Methods in Physics Research A 546 (2005) 274-280, 7 pages.

KLA-Tencor Corporation; PCT International Search Report dated Dec. 29, 2015 for Application No. PCT/US2015/051538, 3 pages.

Fu, Xiaoqian, "Higher Quantum Efficiency by Optimizing GaN Photocathode Structure", 978-1-4244-6644-3/10/ ©2010 IEEE, pp. 234-235 (no month).

Sakic, Agata, "Boron-layer silicon photodiodes for high-efficiency low-energy electron detection", Solid-State Electronics 65-66 (2011), pp. 38-44 (No month).

Omatsu, Takashige et al., "High repetition rate Q-switching performance in transversely diode-pumped Nd doped mixed gadolinium yttrium vanadate bounce laser", Optics Express vol. 14, Issue 7, pp. 2727-2734, Apr. 3, 2006.

\* cited by examiner

PHOTOMULTIPLIER TUBE, IMAGE SENSOR, AND AN INSPECTION SYSTEM USING A PMT OR IMAGE SENSOR

PRIORITY APPLICATION

This application claims priority to U.S. Provisional Patent Application 61/807,058, entitled "PMT, Image Sensor, and an Inspection System Using a PMT or Image Sensor", filed on Apr. 1, 2013, and incorporated by reference herein.

RELATED APPLICATIONS

This application is related to U.S. patent application Ser. No. 13/710,315, entitled "Electron-bombarded charge-coupled device and inspection systems using EBCCD detectors", filed on Dec. 10, 2012, U.S. Provisional Patent Application 61/658,758, entitled "Electron-bombarded CCD and inspection systems using electron-bombarded CCD detectors", filed on Jun. 12, 2012, U.S. patent application Ser. No. 13/792,166, entitled "Back-illuminated sensor with boron layer", filed on Mar. 10, 2013, and U.S. patent application Ser. No. 13/947,975, entitled "PHOTOCATHODE INCLUDING SILICON SUBSTRATE WITH BORON LAYER", filed on Jul. 22, 2013. All of the above applications are incorporated by reference herein.

BACKGROUND OF THE DISCLOSURE

Related Art

Photomultiplier tubes (PMTs) and electron-bombarded charge-coupled devices (EBCCDs) using alkali metal photocathodes and infra-red sensitive III-V semiconductor (such as GaAs) photocathodes are known in the art for use at infra-red and visible wavelengths. Only alkali metal photocathodes have found widespread use for ultra-violet (UV) wavelengths.

FIG. 1 illustrates a known PMT 100 including a photocathode 102, a focusing electrode 104, multiple dynodes 105 (three are shown for illustrative purposes, but a more typical number would be between five and twelve), and an anode 106. All of these components are contained in an evacuated sealed tube 109. The photocathode 102, the focusing electrode 104, the dynodes 105 and the anode 106 have electrical connections (not shown for simplicity). Each dynode 105 is held at a slightly positive voltage relative to the prior dynode 105 (or photocathode 102 for the first dynode). The anode 106 is held at a more positive voltage relative to the last dynode.

When an incident photon 101 is absorbed by the photocathode 102, there is a reasonably high probability (typically between about 10% and 50% in practical devices) of one or more electrons 103 being ejected from the photocathode 102. The focusing electrode 104 deflects the electrons 103 so that most of them will strike the first dynode. When an electron 103 strikes a dynode 105, it will usually cause multiple (typically about 10) secondary electrons to be ejected from that dynode 105. FIG. 1 illustrates this ejection by showing more dashed lines leaving each dynode 105 than striking it. Most of the electrons ejected from one dynode strike the next dynode. This is repeated multiple times, until the amplified signal strikes the anode 106. Thus, the more dynodes 105 in a PMT, the greater the gain, but the longer the time taken for the device to respond to a single photon. Because some electrons from one dynode may miss the next dynode and strike another dynode or the anode 106, more dynodes 105 also mean a broader electrical pulse in response to a single photon, and hence a slower device.

Although FIG. 1 illustrates a transmissive photocathode where the photoelectrons are ejected from the opposite side of the photocathode to the incident photons, reflective photocathodes are also known in the art, where the photoelectrons are ejected from the same side of the photocathode as the incident photons.

UV wavelengths of about 350 nm and shorter correspond to photon energies of about 3.5 eV and greater. When high energy photons are absorbed by the photocathode 102, electrons 103 with an energy of one, or several, eV are generated. Those electrons, after leaving the photocathode 102 and accelerated by an electric field, travel towards dynodes 105 and anode 106 (or an image sensor in an electron-bombarded image sensor). Because of a spread in magnitude and direction of their velocities due to their initial kinetic energy (e.g. one or more eV), the electrons 103 spread laterally as they travel towards the next surface. Moreover, these photoelectrons also arrive at different times at that surface.

In an image sensor, these different arrival times cause blurring of the image. In the PMT 100, these different arrival times slow the response time of the PMT because a single absorbed photon results in a pulse of current that is spread out in time due, at least in part, to the spread in arrival times of the electrons. A further disadvantage of the PMT 100 is that, in order to detect single photons, multiple stages of gain (dynodes 105) are required so that the signal from a single photon is greater than the background noise. Multiple dynodes further slow the response time of the PMT 100. Furthermore, detection of single photons with most conventional photocathodes requires a period of dark adaptation time after exposure to bright light before dark current settles down to a low level. Some photocathodes require cooling to reduce the dark current to levels that allow reliable detection of single photons.

Therefore, a need arises for a photocathode with high quantum efficiency at UV wavelengths, while generating electrons with a low energy spread. A need also arises for a PMT incorporating this efficient, low-electron-energy-spread photocathode. A need also arises for a PMT with single-photon sensitivity, fast response and quick recovery to full sensitivity from high levels of light. A need also arises for an electron-bombarded image sensor, such as an electron bombarded charge coupled device (CCD) or an electron bombarded CMOS image sensor, that has high quantum efficiency, high spatial resolution and low noise. A need also arises for a dark-field wafer, photomask, or reticle inspection system using UV wavelengths and incorporating a high efficiency, low noise PMT, EBCCD, or electron-bombarded CMOS image sensor.

SUMMARY OF THE DISCLOSURE

A photomultiplier tube incorporating an efficient, low-electron-energy-spread photocathode is described. This photomultiplier tube includes a semiconductor photocathode and a photodiode. Notably, the photodiode includes a p-doped semiconductor layer, a n-doped semiconductor layer formed on a first surface of the p-doped semiconductor layer to form a diode, and a pure boron layer formed on a second surface of the p-doped semiconductor layer. A gap between the semiconductor photocathode and the photodiode may be less than about 1 mm or less than about 500 µm.

In one embodiment, the semiconductor photocathode can include gallium nitride. For example, the semiconductor photocathode may include one or more p-doped gallium nitride layers. In another embodiment, the semiconductor photocathode can include silicon. Such a semiconductor photocathode can further include a pure boron coating on at least one surface.

A system for inspecting a sample is also described. This system includes a laser system for generating light. First components direct that light to the sample. Second components direct light from the sample to one or more detectors. At least one detector includes a photomultiplier tube, which incorporates an efficient, low-electron-energy-spread photocathode as described herein.

The PMT and image sensors described herein have higher gain than prior art devices without dynodes or microchannel plates, and a faster response time than prior-art devices that use dynodes or microchannel plates. The image sensors described herein can have higher spatial resolution than prior art devices of similar gain. The PMT and image sensors described herein are simpler than many prior art devices and thus may be less expensive to manufacture and may have a longer operational life.

Small defects scatter low levels of light. More sensitive detectors allow dark-field inspection systems to detect smaller defects or particles. Detectors with better spatial resolution allow dark-field inspection systems to detect smaller defects or particles. Detectors with faster response time allow systems to run faster and reduce the inspection time, thereby increasing the value of those systems to end users.

DETAILED DESCRIPTION OF THE DRAWINGS

Figure 1:
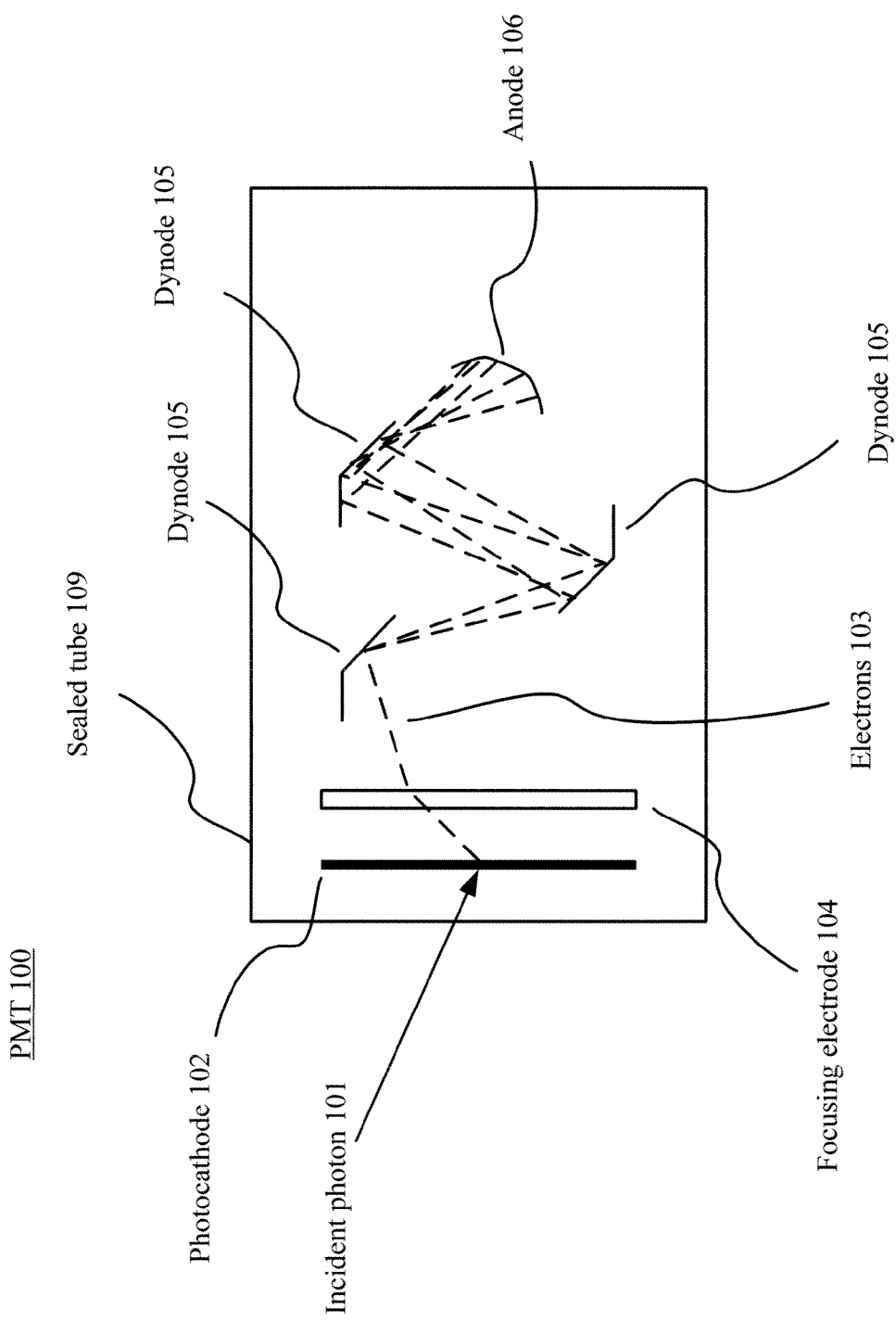
FIG. 1 illustrates a known PMT including a photocathode, a focusing electrode, multiple dynodes, and an anode.
Figure 2:
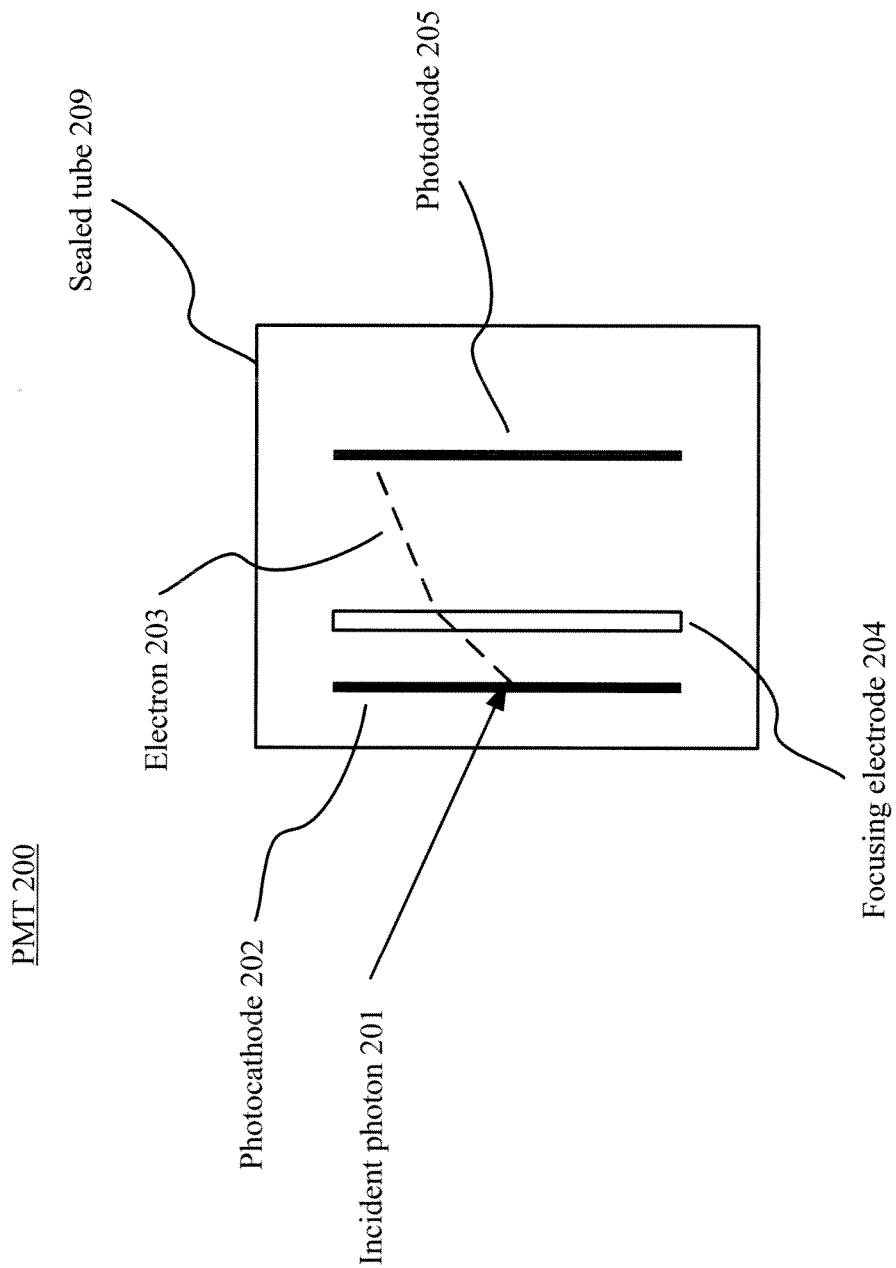
FIG. 2 illustrates a PMT including a photocathode, an optional focusing electrode, and a photodiode all contained within an evacuated, sealed tube.

FIG. 2 illustrates a PMT 200 including a photocathode 202, an optional focusing electrode 204, and a photodiode 205 all contained within an evacuated, sealed tube 209. Notably, the photodiode 205 has a thin (for example, about 2 nm to 20 nm thick) pure boron coating on its surface facing the photocathode 205. The photodiode 205 is held at a positive voltage relative to the photocathode 202. For example, in one embodiment, the photodiode 205 may be at a voltage close to ground potential, whereas the photocathode 202 may be at a negative voltage relative to the photodiode 205 (e.g. a negative voltage between about 100 V and about 500 V). An incident photon 201 is absorbed by photocathode 202 and will likely cause an electron 203 to be ejected from the photocathode 202. Because of the potential difference between the photocathode 202 and the photodiode 205, the electron 203 will be accelerated towards the photodiode 205. Because of the pure boron coating on the surface of the photodiode 205 (described in detail below), any electron striking the photodiode 205 will have an almost 100% probability of being absorbed and of generating multiple electrons within the photodiode 205.

In some embodiments, the gap between photocathode 202 and photodiode 205 may be a few mm. In some preferred embodiments, the gap between photocathode 202 and photodiode 205 may be about 1 mm, or a few hundred µm.

In some embodiments, focusing electrode 204 may be used to ensure that a high percentage of the electrons 203 ejected from the photocathode 202 are directed towards to the photodiode 205. The focusing electrode 204 may be particularly useful when the gap between the photocathode 202 and the photodiode 205 is larger than about 1 mm. In some embodiments, when the gap between the photocathode 202 and the photodiode 205 is about 1 mm or smaller, the focusing electrode 204 may not be needed. The focusing electrode 204 may comprise a cylinder, a mesh, or another electrode structure.

In preferred embodiments, photocathode 202 comprises a GaN photocathode or a boron-coated silicon photocathode. U.S. patent application Ser. No. 13/947,975, entitled "PHOTOCATHODE INCLUDING SILICON SUBSTRATE WITH BORON LAYER", filed on Jul. 22, 2013 by Chuang et al., describes exemplary boron-coated silicon photocathodes suitable for use in the improved PMT described herein. In other embodiments, photocathode 202 may include one or more alkali metals or may comprise another photocathode material known in the art. Photocathode 202 may be a transmissive photocathode, as illustrated in FIG. 2, or it may be a reflective photocathode.

Figure 3A:
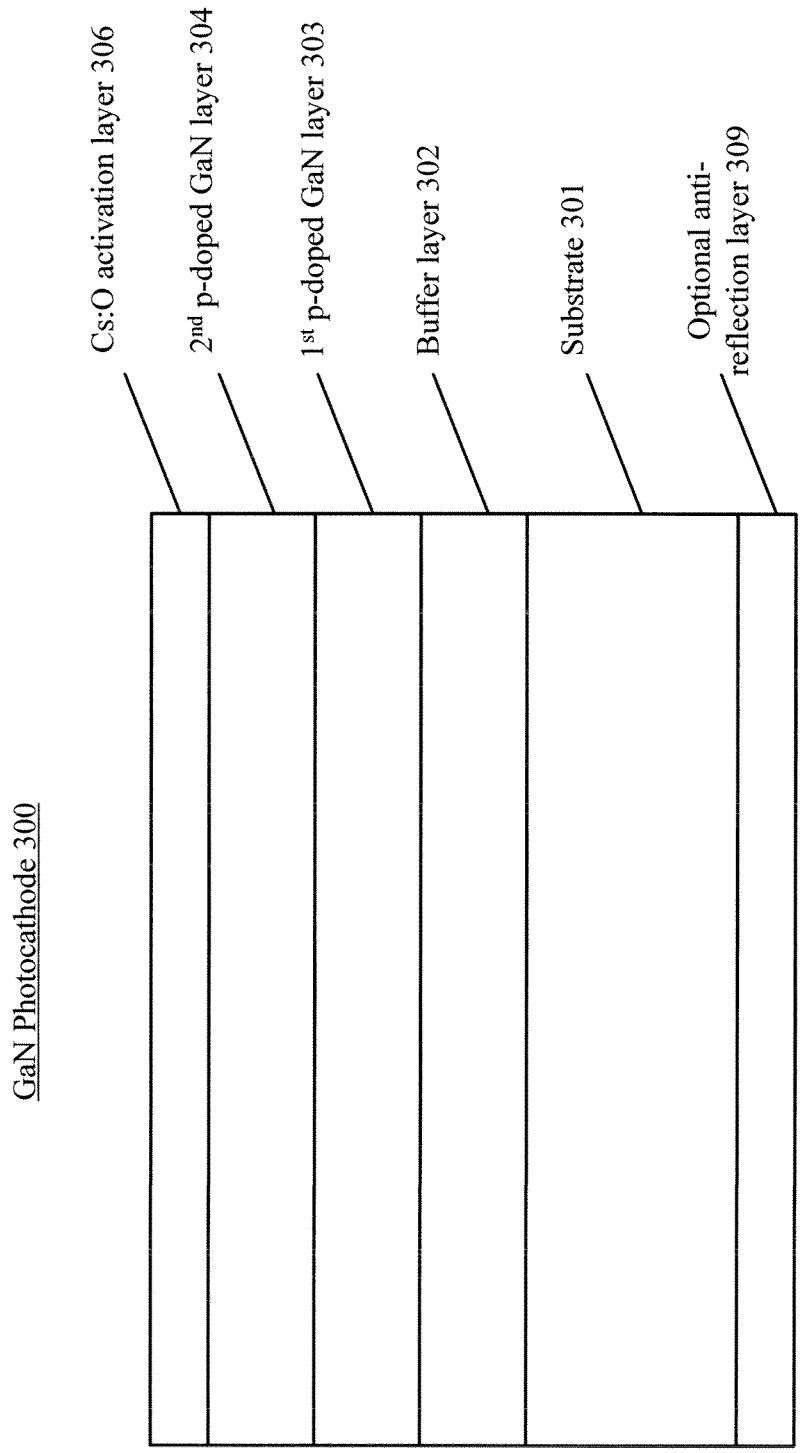
FIGS. 3A and 3B illustrate cross-sections of photocathodes suitable for use in the PMT and image sensor system described herein.
Figure 3B:
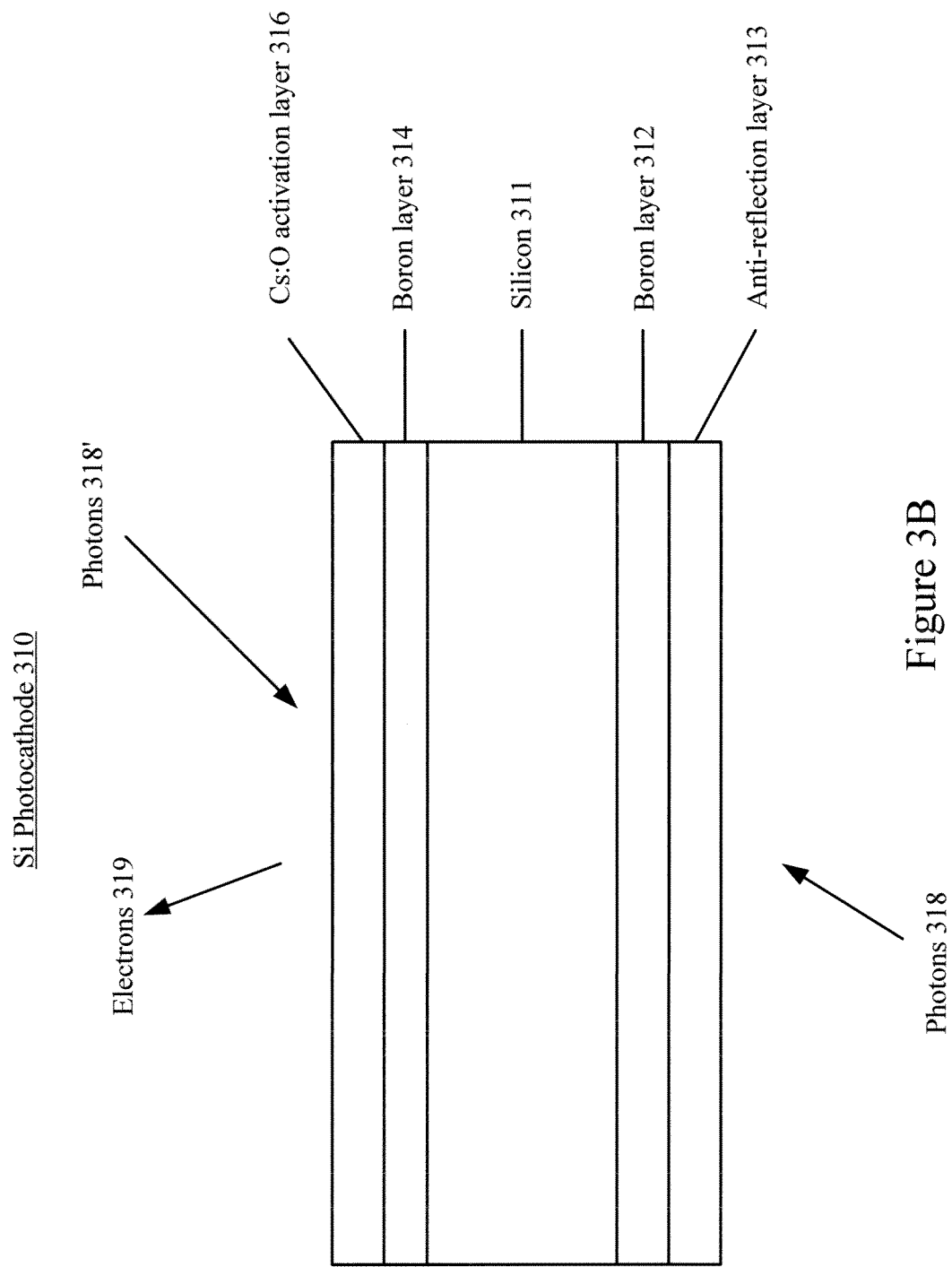

FIGS. 3A and 3B illustrate cross-sections of photocathodes suitable for use in the PMT and image sensor system described herein.

FIG. 3A illustrates a cross section of a GaN photocathode 300 including a plurality of layers on a substrate 301. The substrate 301 may include a sapphire substrate or a highly p-doped GaN substrate (for example, a doping concentration of about $10^{18}$ atoms $cm^{-3}$ greater). In preferred embodiments, the substrate 301 may be between about 100 µm and about 600 µm thick. When the photocathode 300 is to be used in transmission mode, then the substrate 301 must be of high optical quality so that it transmits the wavelength range of interest. When the photocathode 300 is used in reflection mode, the optical quality of the substrate is less critical. For example, if the substrate 301 is a sapphire substrate and the photocathode 300 is to be used in transmission mode for deep UV wavelengths, then very high purity sapphire should be used for the substrate 301.

In some transmission-mode photocathode embodiments, an anti-reflection layer 309 may be deposited on a first surface of the substrate 301. In some embodiments, the anti-reflection layer 309 may comprise one or more layers including magnesium fluoride (MgF$_2$), silicon dioxide (SiO$_2$), and/or hafnium oxide (HfO$_2$).

In some embodiments, a buffer layer 302 is formed (e.g. grown or deposited) on a second surface of the substrate 301. When substrate 301 is a doped gallium nitride (GaN) substrate, then the buffer layer may not be needed. In preferred embodiments, the buffer layer 302 is a layer of Aluminum nitride (AlN) about 5 to 20 nm thick.

On top of the buffer layer 302 (or substrate 301, if the buffer layer 302 is not present) are a plurality of doped GaN layers 303 and 304. First doped GaN layer 303 can include a p-doped layer of GaN having a high doping concentration of about $10^{18}$ atoms cm$^{-3}$. The preferred p-type dopant for first doped GaN layer 303 is magnesium (Mg). Second p-doped GaN layer 304 can include a much lower dopant concentration, e.g. a dopant concentration of approximately $5 \times 10^{16}$ atoms cm$^{-3}$. In some embodiments, additional p-doped GaN layers may be placed between layers 303 and 304. Each of those additional layers should have a dopant concentration with intermediate values between those of layers 303 and 304 so as to form a step-wise decreasing dopant concentration from layer 303 to layer 304. For example, if layer 303 has a dopant concentration of about $10^{18}$ atoms cm$^{-3}$ and layer 304 has a dopant concentration of about $5 \times 10^{16}$ atoms cm$^{-3}$, then a layer (not shown) with a dopant concentration of about $2 \times 10^{17}$ atoms cm$^{-3}$ could be placed between the layers 303 and 304. In preferred embodiments, the thicknesses of the p-doped GaN layer should be similar to one another. The total thickness of all the p-doped GaN layers (e.g. if just two layers are used, then the sum of the thicknesses of layers 303 and 304) should be determined to maximize the quantum efficiency. For example, for a photocathode that has maximum sensitivity in the deep UV, the total thickness of all p-doped GaN layers may be about 180 nm. Exemplary GaN photocathodes are described in "Optimizing GaN photocathode structure for higher quantum efficiency", Optik, 123, pp 756-768 (2012). In one embodiment, a standard Cs:O activation layer 306 can be deposited on the surface of the photocathode 300 from which electrons are ejected.

FIG. 3B illustrates a cross section of a silicon photocathode 310. In transmission mode, photons 318 are incident on one surface of the photocathode 310 and electrons 319 are ejected from the opposite surface. In reflection mode, photons 318' are incident on the same surface as electrons are ejected from. In one embodiment, the silicon photocathode 310 includes silicon 311, preferably a single crystal of silicon. In some embodiments, the silicon photocathode 310 includes polycrystalline silicon or multi-crystalline silicon. Depending on the intended wavelength operating range of the photocathode, the silicon 311 may be between about 10 nm and about 100 μm in thickness.

When intended for use as a transmission mode photocathode, the surface of the silicon on the side from which the light 318 is incident may, optionally, be coated with an anti-reflection (AR) layer 313. An exemplary AR layer 313 may include one or more layers of transparent or semi-transparent materials, such as MgF$_2$, SiO$_2$, Al$_2$O$_3$ and HfO$_2$. For some embodiments intended for operation at deep UV or vacuum UV wavelengths in transmission mode, a thin pure boron layer 312 may be present between the AR layer 313 and the silicon 311. This pure boron layer 312 may be between about 2 nm and 4 nm thick.

The silicon 311 is coated with a thin pure boron layer 314 on the surface from which electrons are ejected. The pure boron layer 314 is preferably between about 2 nm and 20 nm thick. In one embodiment, a standard Cs:O (cesium:oxygen) activation layer 316 can be deposited on the surface of the photocathode from which electrons are ejected.

An exemplary silicon photocathode structure suitable for use in a PMT or an electron-bombarded image sensor system is described in the above-cited U.S. patent application Ser. No. 13/947,975, entitled "PHOTOCATHODE INCLUDING SILICON SUBSTRATE WITH BORON LAYER", filed on Jul. 22, 2013.

Figure 4:
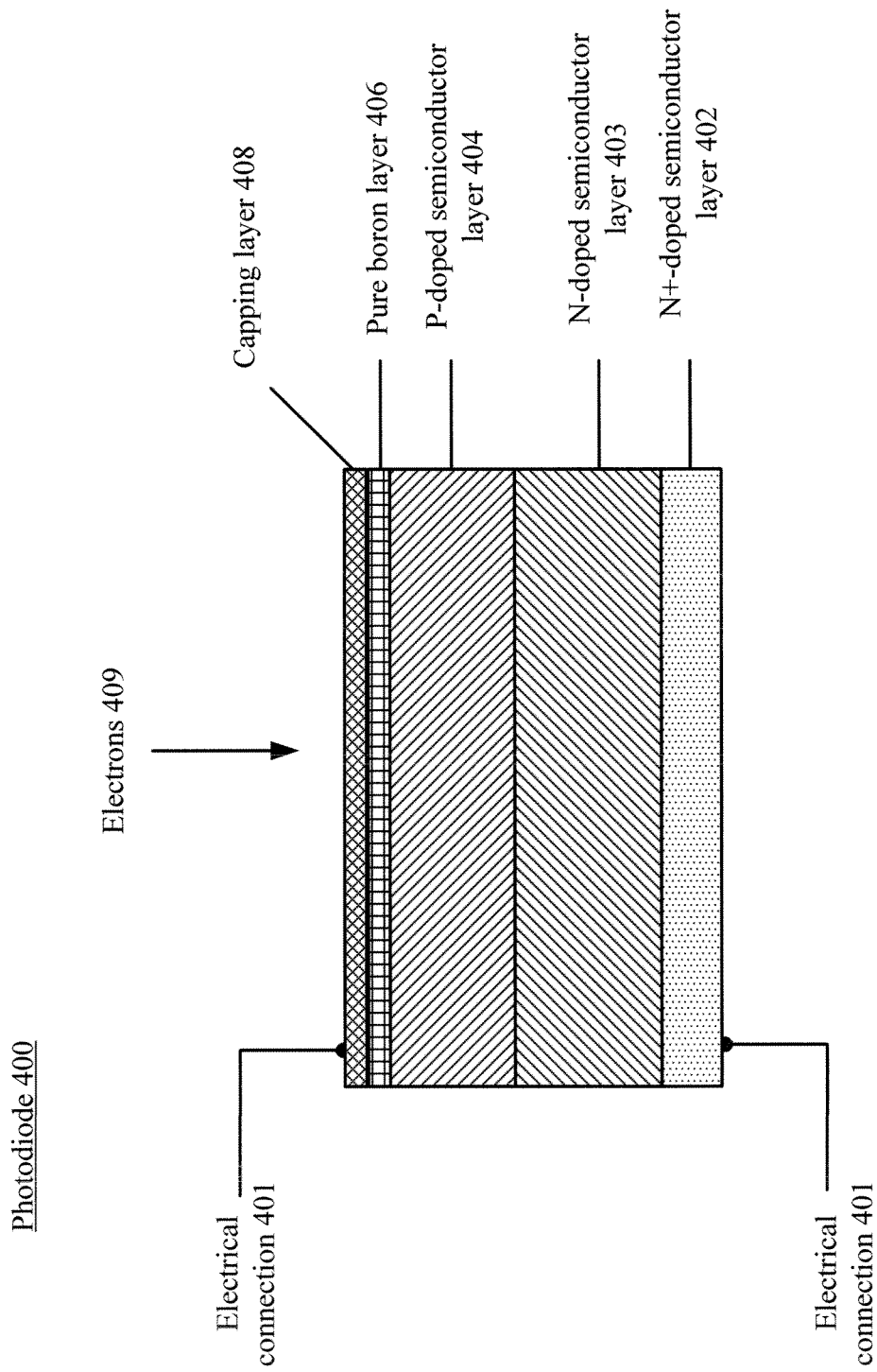
FIG. 4 illustrates a cross-section of a photodiode suitable for use in a PMT described herein.

FIG. 4 illustrates a cross-section of a photodiode 400 suitable for use in a PMT described herein. Note that although this diode is referred to herein as a photodiode, it is to be understood that, in the PMT disclosed herein, it is actually detecting electrons and converting incident electrons into an electrical current, rather than directly detecting photons. The structure, function, and associated circuits are similar to those used for photodiodes, so it is convenient to refer to it as a photodiode. Also note that this cross section is not drawn to scale, but is merely intended to illustrate important aspects of the structure of the photodiode device as used in the PMT described herein.

Photodiode 400 comprises a pn or pin junction formed by a p-doped semiconductor layer 404 (anode) contacting an n-doped semiconductor layer 403 (cathode). In preferred embodiments, the n-doped semiconductor layer 403 is lightly n-doped (designated as N-doped in FIG. 4). The n doping may be done with phosphorous, arsenic, or another n-type dopant. The p doping for p-doped semiconductor layer 404 may be done with boron or another p-type dopant. A pure boron layer 406 is formed on a surface of the p-doped semiconductor layer 404. In some embodiments, a separate p implant or doping step may be unnecessary because enough boron may diffuse into the surface of the p-doped semiconductor layer 404 during the deposition of pure boron layer 406.

Electrical connections 401 are made to the anode and cathode. To have a low resistance contact to the cathode, a highly n-doped semiconductor layer 402 (designated N+ doped in FIG. 4) may be formed on a surface of the N-doped semiconductor layer 403. To have a low resistance contact to the anode, a capping layer 408 comprising a thin (such as between about 1 nm and about 20 nm thick) conductive material such as semi-metal (e.g. titanium nitride (TiN)) or a metal may be formed on a surface of the pure boron layer 406. In some embodiments, the capping layer 408 may be omitted because the conductivity of the surface of the p-doped semiconductor layer 404 is sufficient. This may be the case when the PMT is intended only to operate with low light levels and never exposed to high light levels, because the photodiode current will always remain relatively low in such cases. When the PMT may be exposed to high light levels, even occasionally, the capping layer 408 can provide additional advantages of reducing charge up of the anode surface of the photodiode 400, and of protecting the pure boron layer 406 from being sputtered by incident electrons 409.

In one embodiment, a thick pure boron layer 406 (e.g. approximately 2 nm to 20 nm) can be directly formed on top of the p-doped semiconductor layer 404. The pure boron layer 406 allows low energy electrons to penetrate into the p-doped semiconductor layer 404. It is important that the pure boron layer 406 cover the entire area where electrons will be incident and be pinhole free, thereby preventing the growth of a native oxide film on the surface of the semiconductor. Note that a native oxide film would charge up when hit by electrons and could repel low energy electrons, thereby greatly reducing the sensitivity of the photodiode when the PMT operates at a low voltage. Operation of the PMT at a low voltage is important because it allows a small gap between the photocathode and the photodiode, which speeds the response time of the PMT as the electrons take less time to cross that gap. Furthermore, a low voltage difference between the photocathode and photodiode 400 minimizes sputtering and damage to the pure boron layer 406 and the p-doped semiconductor layer 404 that can be caused by high energy electrons.

The quality of the pure boron layer 406 is critical to the optimal performance of the photodiode. The surface of p-doped semiconductor layer 404 should be clean of contaminants and native oxide prior to deposition of the pure boron layer. More details on boron deposition can be found in "Chemical vapor deposition of a-boron layers on silicon for controlled nanometer-deep p+-n junction formation," Sarubbi et al., J. Electron. Material, vol. 39, pp. 162-173 (2010). In preferred embodiments, the photodiode 400 is operated reverse biased (i.e. the anode is slight negative relative to the cathode) in order to have a fast response and low dark current.

Figure 5:
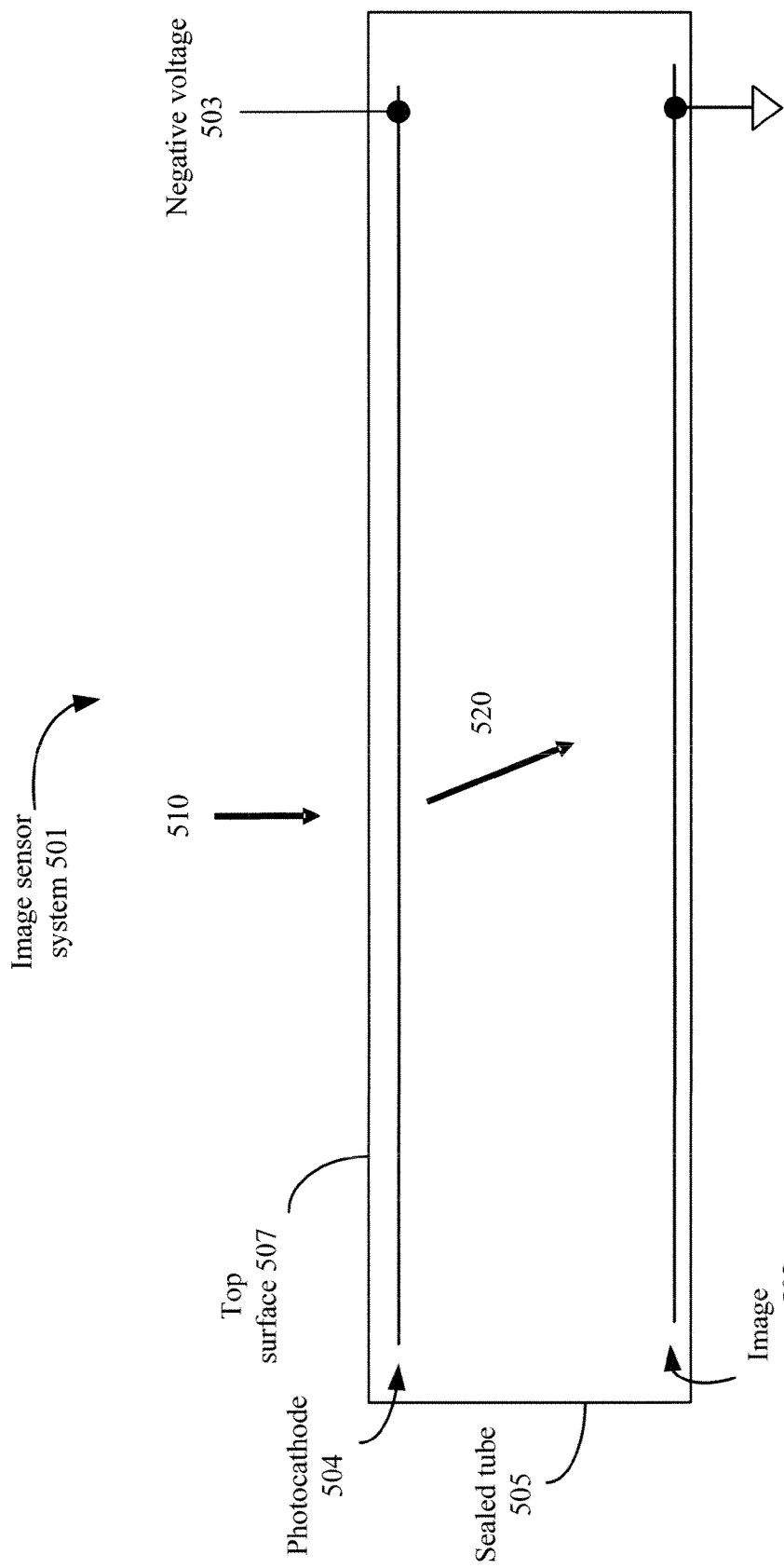
FIG. 5 illustrates an exemplary electron-bombarded image sensor system.

FIG. 5 illustrates an exemplary electron-bombarded image sensor system 501. In this embodiment, the whole assembly can be contained in a sealed tube 505 (e.g. substantially similar to the sealed tube of standard image intensifier and electron-bombarded CCD (EBCCD) devices). A top surface 507 of the tube 505 can include a window that is transparent at the wavelengths of interest. For UV sensitive electron-bombarded image sensors, this window preferably comprises a very pure grade of quartz, fused silica or alumina (sapphire). In some preferred embodiments, the outside surface of the window is coated with a UV anti-reflection coating. Such a coating might comprise a single layer of a low index material, such as $MgF_2$, or might comprise a multi-layer coating.

Coated on the inside surface of the window, or placed immediately adjacent to that inside surface, is a photocathode 504. The photocathode material may be substantially similar to any photocathode material known in the art for use in photomultiplier, image intensifier, or prior-art EBCCD detectors. In preferred embodiments, the photocathode 504 may comprise one or more alkali metals such as cesium, and/or may comprise a semiconductor such GaN, GaAs, or silicon. The photocathode 504 can be held at a negative voltage 503 relative to a solid-state image sensor 502, which is positioned near the bottom surface of sealed tube 505. In some embodiments, the negative voltage 503 may be approximately 500 V; in other embodiments, it may be a few hundred volts or approximately 1000 V. In preferred embodiments, the negative voltage 503 is between 100 V and 1500 V.

The solid-state image sensor 502 can be a thinned CCD or CMOS image sensor oriented so that the electrons impinge first on its back-side surface. The back-side of solid-state image sensor 502 includes a layer of boron deposited directly on the epi layer of the image array. In some embodiments, a thin (few nm) layer of a conductive material, such as a refractory metal, is deposited on the boron layer to prevent charge-up of the sensor surface. A refractory metal such as titanium, tungsten, tantalum, rhodium, ruthenium, vanadium or chromium, has advantages compared with non-refractory metals because refractory metals' hardness makes them resistant to sputtering by the electrons, and they are relatively resistant to oxidation at room temperature. In some embodiments, the solid-state image sensor 502 is a time-delay integration (TDI) CCD. In some embodiments, the solid-state image sensor 502 comprises a linear array of electron-sensitive elements. In other embodiments, the solid-state image sensor 502 comprises a two-dimensional array of electron sensitive elements. In some preferred embodiments, the solid-state image sensor 502 is held close to ground potential (shown).

When light 510 is incident on the electron-bombarded image sensor system 501, one or more photoelectrons 520 are emitted from the photocathode 504. These photoelectrons are emitted in substantially all directions, but they are accelerated towards the solid-state image sensor 502 by the potential difference between the photocathode 504 and the solid-state image sensor 502. In preferred embodiments, the gap between the photocathode 504 and the solid-state image sensor 502 is less than 1 mm. In some embodiments, the gap is approximately 500 µm.

Incorporating the solid-state image sensor 502 having one of the structures and/or fabricated in accordance with any of the methods described herein enables the electron-bombarded image sensor system 501 to operate with a low potential difference between the photocathode 504 and the solid-state image sensor 502, and yet have high gain because electrons are more easily able to penetrate through the boron layer (of the image sensor 502) than through a silicon dioxide layer. Because boron-doped silicon, boron silicide, and boron are all at least partially conductive, charging of the surface under electron bombardment is minimized or avoided. The sensitivity to charge up can be further reduced by a conductive or metallic layer on top of the boron layer as described herein.

In prior art EBCCD sensors, the gap between the photocathode and the image sensor is typically 1-2 mm. Such a large gap allows significant transverse motion of the electrons as they travel from the photocathode to the image sensor due to energy of the electrons as they emerge from the photocathode. A gap of 1-2 mm or more is necessary because of the large potential difference between the photocathode and the image sensor (typically about 2000 V or more). Reducing the potential difference between the photocathode and the image sensor allows a smaller gap to be used. Furthermore, the lower energy of the electrons means that there is less spreading of the electrons created within the solid-state image sensor.

The low energy of the electrons arriving at the image sensor 502 means that the probability of atoms being ablated from its surface is low to zero. Furthermore, the energy of the electrons arriving at the solid state image sensor 502 is not enough to generate X-rays from the silicon, thereby avoiding the generation of spurious signals in nearby pixels of the image sensor 502.

Collisions of low energy electrons with residual gas atoms in the vacuum created in the sealed tube 505 will generate fewer ions as compared with high energy electrons. Furthermore, due to the low potential difference between the photocathode 504 and the image sensor 502, those ions will have less kinetic energy when they strike the photocathode and will ablate less photocathode material.

More details of the image sensor system 501 can be found in U.S. Published Application 2013/0264481, entitled "Back-illuminated sensor with boron layer", filed Mar. 10, 2013 and published Oct. 10, 2013. Additional details of electron-bombarded image sensors that can be incorporated into the image sensor system 501 can be found in U.S. Published Application 2013/0148112, entitled "Electron-bombarded charge-coupled device and inspection systems using EBCCD detectors", filed on Dec. 10, 2012 and published Jun. 13, 2013. Both of these applications are incorporated by reference herein.

Figure 6:
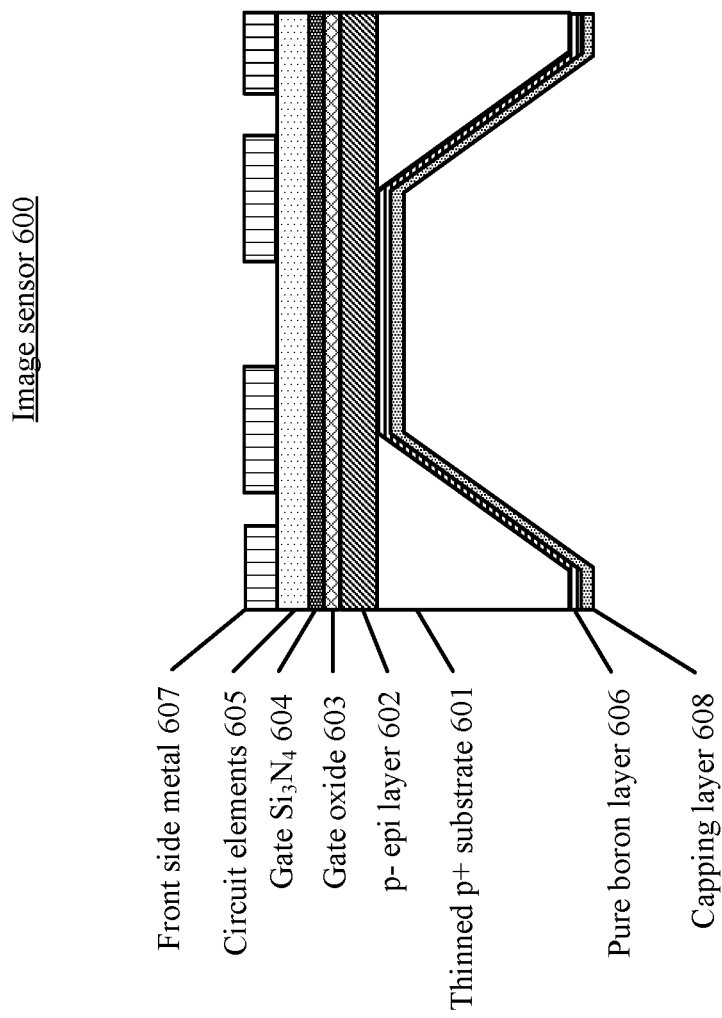
FIG. 6 illustrates a cross-section of an exemplary back-thinned image sensor suitable for use in the image sensor system shown in FIG. 5.

FIG. 6 illustrates a cross-section of an exemplary back-thinned image sensor 600 suitable for use in image sensor system 501 (FIG. 5). In one embodiment, an epitaxial (epi) layer 602 is formed on a front side of a substrate 601. In one embodiment, the substrate 601 is a p+ (i.e. highly p doped) substrate, and the epi layer 602 is a p- (i.e. a layer with a low concentration of p dopant) epi layer. One or more gate dielectric layers, such as a gate oxide layer 603 and a silicon nitride ($Si_3N_4$) gate layer 604 may be formed on the epi layer 602. Note that depending on the type of image sensor technology, each of the gate dielectric layers may comprise one, two, or three layers. Front-side circuit elements 605 may be formed on gate layer 604. Forming the front-side circuit elements 605 may include implanting or doping portions of the front side of the epi layer 602 and may involve patterning the gate layers 603 and 604. Front-side metal (i.e. interconnect) 607 can be formed on the front-side circuit elements 605.

As shown in FIG. 6, the substrate 601 is thinned from its back-side surface, at least in certain areas, so that electrons can impinge directly on the epi layer 602. In one embodiment, a pure boron layer 606 (e.g. between about 2 nm and about 20 nm thick) is formed on thinned substrate 601 and exposed portions of the epi layer 602. In some embodiments a capping layer 608 can be formed on the pure boron layer 606. The capping layer 308 can include a thin conductive film, such a layer between about 1 nm and about 20 nm thick of a metal or semi-metal.

More details and alternative embodiments of the image sensor 600 as well as methods of fabricating the image sensor 600 can be found in U.S. patent application Ser. No. 13/792,166, entitled "Back-illuminated sensor with boron layer", filed Mar. 10, 2013.

Figure 7A:
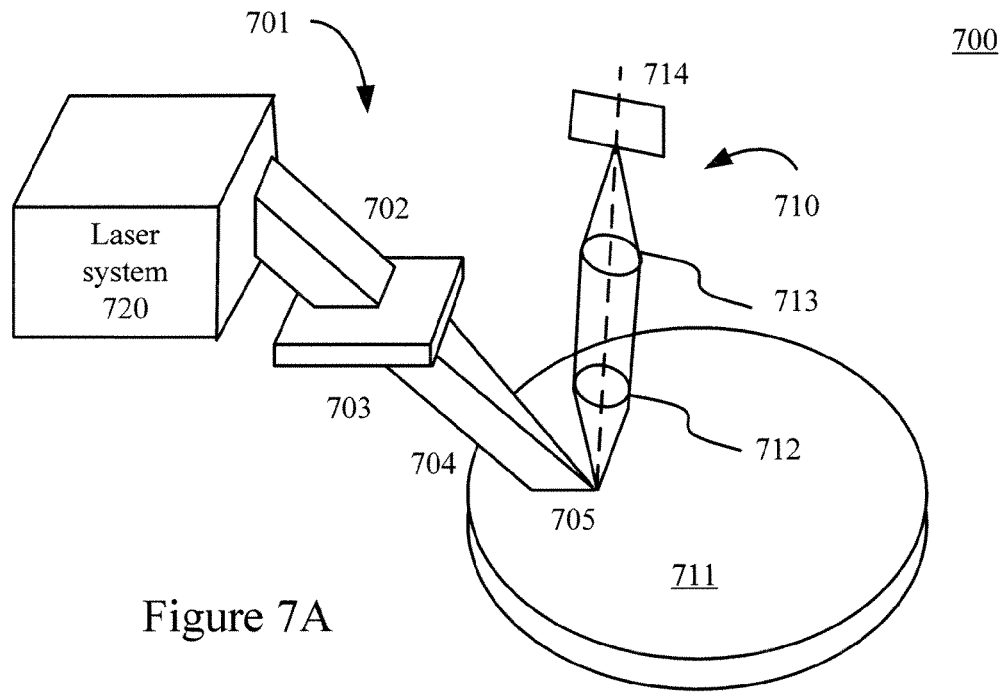
FIGS. 7A and 7B illustrate exemplary dark-field inspection systems with multiple collection systems suitable for use with the PMT or image sensor described herein.
Figure 7B:
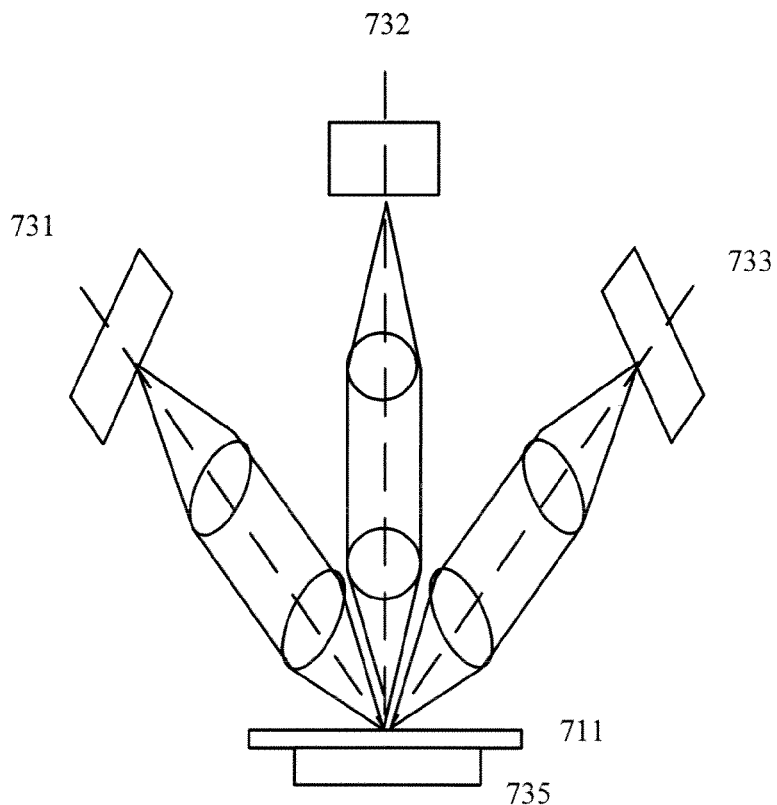

FIGS. 7A and 7B illustrate an exemplary dark-field inspection system with multiple collection systems suitable for use with the PMT or image sensor described herein.

FIG. 7A illustrates an exemplary surface inspection apparatus 700 that includes an illumination system 701 and a collection system 710 for inspecting areas of a sample surface 711. As shown in FIG. 7A, a laser system 720 directs a light beam 702 through a lens 703. The lens 703 is oriented so that its principal plane is substantially parallel to the surface 711 and, as a result, an illumination line 705 is formed on the surface 711 in the focal plane of the lens 703. In addition, the light beam 702 and a focused beam 704 are directed at a non-orthogonal angle of incidence to the surface 711. In particular, the light beam 702 and the focused beam 704 may be directed at an angle between about 1 degree and about 85 degrees from a normal direction to the surface 711. In this manner, the illumination line 705 is substantially in the plane of incidence of the focused beam 704.

The collection system 710 includes a lens 712 for collecting light scattered from the illumination line 705 and a lens 713 for focusing the light coming out of the lens 712 onto a device 714. The device 714 may include an array of light sensitive detectors (such as an array of PMTs) or an electron-bombarded image sensor. In preferred embodiments, the PMTs or electron-bombarded image sensor comprise a boron coated detector, such as a boron-coated photodiode, or a boron-coated image sensor as described herein. In preferred embodiments, the PMT or image sensor may further comprise a GaN or silicon photocathode as described herein. The linear array of detectors within the device 714 can be oriented parallel to the illumination line 715. In one embodiment, multiple collection systems can be included, wherein each of the collection systems includes similar components, but differ in orientation.

For example, FIG. 7B illustrates an exemplary array of collection systems 731, 732, and 733 for a surface inspection apparatus (wherein its illumination system, e.g. similar to that of illumination system 701, is not shown for simplicity). First optics in the collection system 731 collect light scattered in a first direction from the surface of the surface 711. Second optics in the collection system 732 collect light scattered in a second direction from the surface 711. Third optics in the collection system 733 collect light scattered in a third direction from the surface 711. Note that the first, second, and third paths are at different angles of reflection to the surface 711. A platform 735 supporting the sample can be used to cause relative motion between the optics and surface 711 so that the whole surface can be scanned. At least one of the collection systems 731, 732, and 733 may include an array of light sensitive detectors (such as an array of PMTs) or an electron-bombarded image sensor as described herein. U.S. Pat. No. 7,525,649, which issued on Apr. 28, 2009 and is incorporated by reference herein, describes the surface inspection apparatus 700 and other multiple collection systems in further detail.

Figure 8:
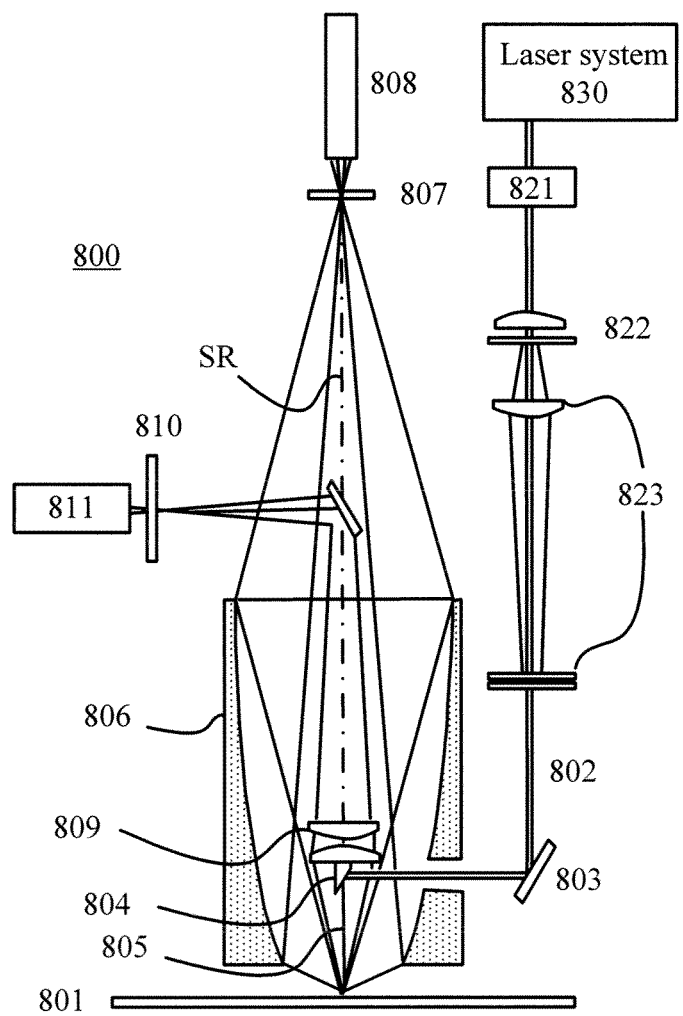
FIG. 8 illustrates an exemplary surface inspection system that can be used for inspecting anomalies on a surface.

FIG. 8 illustrates an exemplary surface inspection system 800 that can be used for inspecting anomalies on a surface 801. In this embodiment, the surface 801 can be illuminated by a substantially stationary illumination device portion of a laser system 830, which generates a laser beam. The output of the laser system 830 can be consecutively passed through polarizing optics 821, a beam expander and aperture 822, and beam-forming optics 823 to expand and focus the beam.

The resulting focused laser beam 802 is then reflected by a beam folding component 803 and a beam deflector 804 to direct the beam 805 towards the surface 801. In a preferred embodiment, the beam 805 is substantially normal or perpendicular to the surface 801, although in other embodiments, the beam 805 may be at an oblique angle to the surface 801.

In one embodiment, the beam 805 is substantially perpendicular or normal to the surface 801 and the beam deflector 804 reflects the specular reflection of the beam from the surface 801 towards the beam turning component 803, thereby acting as a shield to prevent the specular reflection from reaching detectors (described below). The direction of the specular reflection is along line SR, which is normal to the surface 801 of the sample. In one embodiment where the beam 805 is normal to the surface 801, this line SR coincides with the direction of the beam 805, where this common reference line or direction is referred to herein as the axis of surface inspection system 800. Where the beam 805 is at an oblique angle to the surface 801, the direction of specular reflection SR would not coincide with the incoming direction of the beam 805; in such instance, the line SR indicating the direction of the surface normal is referred to as the principal axis of the collection portion of the surface inspection system 800.

Light scattered by small particles is collected by a mirror 806 and directed towards an aperture 807 and a detector 808. Light scattered by large particles are collected by lenses 809 and directed towards an aperture 810 and a detector 811. Note that some large particles will scatter light that is also collected and directed to the detector 808, and similarly some small particles will scatter light that is also collected and directed to the detector 811, but such light is of relatively low intensity compared to the intensity of scattered light the respective detector is designed to detect. In one embodiment, the either or both detectors 808 and 811 can include a PMT or an array of PMTs as described herein. In another embodiment, either or both detectors 808 and 811 include an electron-bombarded image sensor as described herein. In one embodiment, inspection system can be configured for use in detecting defects on unpatterned wafers. U.S. Pat. No. 6,271,916, which issued on Aug. 7, 2011 and is incorporated by reference herein, describes surface inspection system 800 in further detail.

Figure 9:
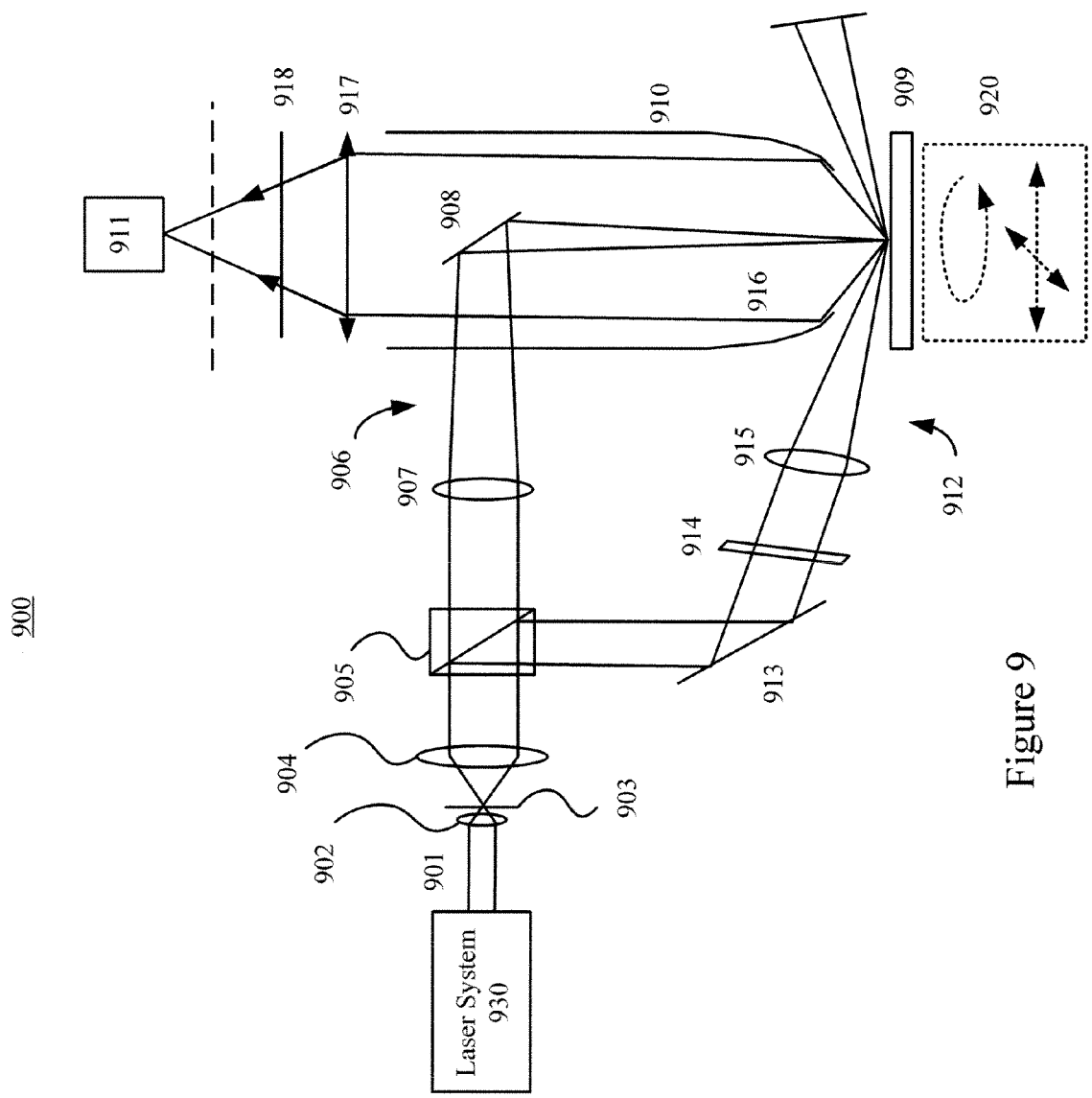
FIG. 9 illustrates an exemplary inspection system configured to implement anomaly detection using both normal and oblique illumination beams.

FIG. 9 illustrates an exemplary inspection system 900 configured to implement anomaly detection using both normal and oblique illumination beams. In this configuration, a laser system 930 can provide a laser beam 901. A lens 902 focuses the beam 901 through a spatial filter 903 and a lens 904 collimates the beam and conveys it to a polarizing beam splitter 905. A beam splitter 905 passes a first polarized component to a normal illumination channel 906 and a second polarized component to an oblique illumination channel 912, where the first and second components are orthogonally polarized. In the normal illumination channel 906, the first polarized component is focused by optics 907 and reflected by a mirror 908 towards a surface of a sample 909. The radiation scattered by sample 909 is collected and focused by a paraboloidal mirror 910 to a detector 911. The detector 911 includes a PMT as described herein.

In the oblique illumination channel 912, the second polarized component is reflected by a beam splitter 905 to a mirror 913, which reflects such beam through a half-wave plate 914 and focused by optics 915 to the sample 909. Radiation originating from the oblique illumination beam in the oblique illumination channel 912 and scattered by the sample 909 is also collected by a paraboloidal mirror 910 and focused to a detector 911, which has a pinhole entrance. The pinhole and the illuminated spot (from the normal and oblique illumination channels on the sample 909) are preferably at the foci of a paraboloidal mirror 910. Note that curved mirrored surfaces having shapes other than paraboloidal shapes may also be used.

The paraboloidal mirror 910 collimates the scattered radiation from the sample 909 into a collimated beam 916. The collimated beam 916 is then focused by an objective 917 through an analyzer 918 to the detector 911. The detector 911 may include one or more light sensitive detectors, such as one or more PMTs or electron-bombarded image sensors as described herein. An instrument 920 can provide relative motion between the beams and the sample 909 so that spots are scanned across the surface of the sample 909. U.S. Pat. No. 6,201,601, which issued on Mar. 13, 2001 and is incorporated by reference herein, describes inspection system 900 in further detail.

Figure 10:
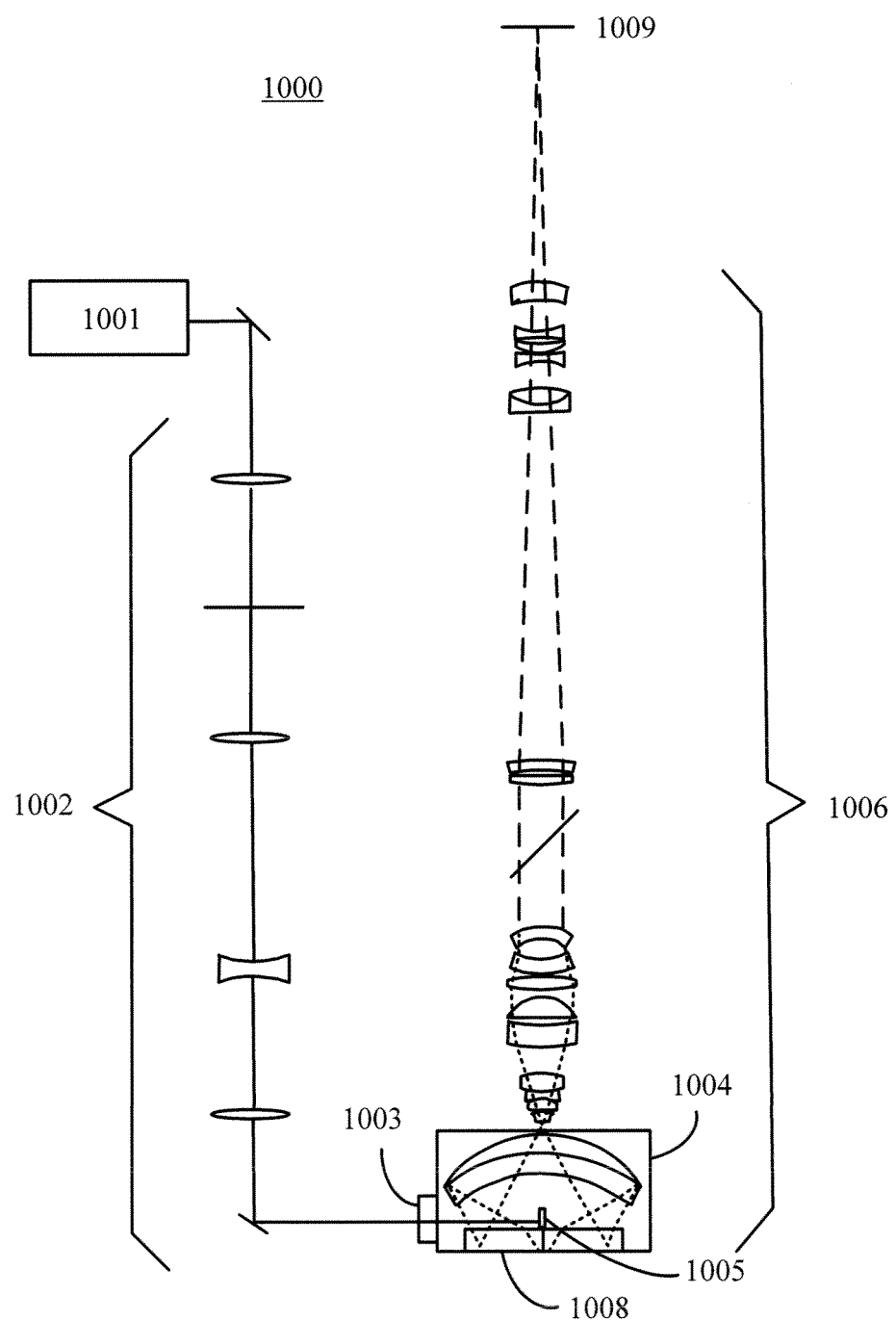
FIG. 10 illustrates the addition of a normal incidence laser dark-field illumination to an exemplary catadioptric imaging system.

FIG. 10 illustrates the addition of a normal incidence laser dark-field illumination to an exemplary catadioptric imaging system 1000. The dark-field illumination includes a UV laser 1001, adaptation optics 1002 to control the illumination beam size and profile on the surface being inspected, an aperture and window 1003 in a mechanical housing 1004, and a prism 1005 to redirect the laser along the optical axis at normal incidence to the surface of a sample 1008. The prism 1005 also directs the specular reflection from surface features of the sample 1008 and reflections from the optical surfaces of an objective 1006 along the optical path to an image plane 1009. Lenses for the objective 1006 can be provided in the general form of a catadioptric objective, a focusing lens group, and a zooming tube lens section. In a preferred embodiment, the image plane 1009 includes one or more light sensitive detectors, such as one or more PMTs or electron-bombarded image sensors, as described herein. U.S. Pat. No. 5,999,310, which issued on Dec. 7, 1999 and U.S. Publication 2007/0002465, which published on Jan. 4, 2007 describe catadioptric imaging system 1000 in further detail. Both the patent and the publication are incorporated by reference herein.

The various embodiments of the structures, methods, and systems described above are illustrative only of the principles of this invention and are not intended to limit the scope of the invention to the particular embodiments described. For example, the photocathode of the PMT or electron-bombarded image may comprise any type of photocathode known in the art. In another example, a PMT or electron-bombarded image sensor as described herein may be incorporated into any metrology or inspection system, not limited to the specific systems described herein. In yet another example, an inspection system incorporating a PMT or electron-bombarded image sensor as described herein may use a broad-band light source such as a laser-pumped plasma light source or an arc lamp, rather than a laser as in the illustrative examples herein. Thus, the invention is limited only by the following claims and their equivalents.

The invention claimed is:

1. A photomultiplier tube comprising:
   a semiconductor photocathode; and
   a photodiode including:
      a p-doped semiconductor layer;
      a n-doped semiconductor layer formed on a first surface of the p-doped semiconductor layer to form a diode; and
      a pure boron layer formed on a second surface of the p-doped semiconductor layer,
   wherein the semiconductor photocathode comprises silicon, and
   wherein the semiconductor photocathode further comprises a pure boron coating on at least one surface.

2. The photomultiplier tube of claim 1 wherein the semiconductor photocathode comprises gallium nitride.

3. The photomultiplier tube of claim 2, wherein the semiconductor photocathode further comprises one or more p-doped gallium nitride layers.

4. The photomultiplier tube of claim 1, wherein a gap between the semiconductor photocathode and the photodiode is less than about 1 mm.

5. The photomultiplier tube of claim 4 wherein a gap between the semiconductor photocathode and the photodiode is less than about 500 μm.

6. The photomultiplier tube of claim 1, wherein said silicon of said semiconductor photocathode comprises opposing surfaces, and semiconductor photocathode comprises first and second pure boron coatings respectively disposed on the opposing surfaces.

7. The photomultiplier tube of claim 1, wherein said semiconductor photocathode further comprises an anti-reflection layer disposed over a light receiving surface of the silicon.

8. The photomultiplier tube of claim 7, wherein the anti-reflection layer is disposed on the pure boron coating and comprises one of $MgF_2$, $SiO_2$, $Al_2O_3$ and $HfO_2$.

9. The photomultiplier tube of claim 1, wherein said semiconductor photocathode further comprises an activation layer disposed over an electron emitting surface of the silicon.

10. The photomultiplier tube of claim 9, wherein the activation layer is disposed on the pure boron coating and comprises Cs (cesium).

* * * * *